United States Patent [19]
Khoury

[11] Patent Number: 5,093,634
[45] Date of Patent: Mar. 3, 1992

[54] MERGED CURRENT CLAMP IN TRIPLE-INPUT TRANSCONDUCTOR, FOR USE IN OSCILLATOR

[75] Inventor: John M. Khoury, New Providence, N.J.

[73] Assignee: AT&T Bell Laboratories, Murray Hill, N.J.

[21] Appl. No.: 607,019

[22] Filed: Oct. 31, 1990

[51] Int. Cl.$^5$ .............................................. H03B 5/24
[52] U.S. Cl. .............................. 331/108 B; 330/253; 331/111; 331/135; 331/177 R
[58] Field of Search ..................... 331/108 B, 111, 135, 331/136, 143, 177 R, 182; 330/253, 277

[56] References Cited

U.S. PATENT DOCUMENTS

| | | | |
|---|---|---|---|
| 4,405,900 | 9/1983 | van de Plassche | 330/253 X |
| 4,897,612 | 1/1990 | Carroll | 330/253 |
| 5,025,231 | 6/1991 | Schwartzbach | 331/116 R |

OTHER PUBLICATIONS

Linares-Barranco, B. et al, "Very High Frequency CMOS OTA-C Quadrature Oscillators," Proc. IEEE-/ISCAS 1990, May 1-3, 1990, New Orleans, La., pp. 3189-3192.

Primary Examiner—Siegfried H. Grimm
Attorney, Agent, or Firm—David I. Caplan

[57] ABSTRACT

A clamped linear transconductance amplifier path, consisting essentially of a current clamp merged in a linear transconductance amplifier path, is used in a triple-input, triple-output transconductor (200). In a balanced transconductor in CMOS technology, this clamped linear transconductance amplifier path is formed by a p-channel MOS transistor (M23) separately connected in series with each of a matched pair of p-channel MOS transistors (M21,M22). The clamped linear transconductance amplifier path, together with two other transconductance paths (M15-M20; M9-M14), can be interconnected to form the input side of the triple-input, triple-output transconductor (200). By summing and integrating the outputs of the input side of the triple-input transconductor (200), the output ($V_{OUT,P}$ and $V_{OUT,N}$) of the output side of the transconductor can be formed. By feeding back this output to the input side of the transconductor (200), an oscillator can be obtained.

3 Claims, 2 Drawing Sheets

MERGED CURRENT CLAMP IN TRIPLE-INPUT TRANSCONDUCTOR, FOR USE IN OSCILLATOR

TECHNICAL FIELD

This invention relates to semiconductor integrated circuits and more particularly to transconductors, for use in oscillator circuits.

BACKGROUND OF THE INVENTION

Oscillator circuits are useful for providing a stable frequency for use in such devices as frequency filters and mixers.

In a paper by B. Linares-Barranco et al entitled "Very High Frequency CMOS OTA-C Quadrature Oscillators," published in Proc. IEEE/ISCAS 1990, International Symposium on Circuits and Systems, May 1-3, 1990, pp. 3189-3192, a block diagram of a quadrature oscillator was disclosed which included a triple-input integrator, one of the inputs being negative feedback from a single-input integrator. Another of its inputs included a positive-input path containing a clamp connected in series with an auxiliary amplifier.

The use of the clamp connected in series with the auxiliary amplifier introduces added circuitry which, in turn, undesirably dissipates power and lowers the cutoff frequency. Therefore, it would be desirable to have a quadrature oscillator without these disadvantages.

SUMMARY OF THE INVENTION

An improved quadrature oscillator—i.e., with higher cutoff frequency and lower power dissipation—is achieved by using a circuit including a triple-input transconductor comprising a current clamp that is merged in a linear transconductance amplifier path. For example, in complementary MOS (CMOS) technology in which the transconductor is balanced (with respect to positive and negative polarity), the merged element consists essentially of a p-channel MOS transistor whose source-drain path is connected separately in series with each of the source-drain paths of a matched pair of p-channel MOS transistors, the gate terminal of one of which serves as a positive input point and the gate terminal of the other of which serves as a negative input point. During operation, feedback voltages are applied to this matched pair of transistors whereby the difference in source-drain currents flowing through these transistors approaches a limit (is clamped) when the magnitude of the difference in these applied feedback voltages exceeds a prescribed value. In a preferred embodiment the triple-input transconductor is constructed in balanced form, and this transconductor feeds forward to a balanced single-input transconductor whose output is fed back as one of the inputs to the triple-input transconductor.

BRIEF DESCRIPTION OF THE DRAWING(S)

This invention together with its features, advantages, and characteristics may be better understood from the following detailed description in which.

DETAILED DESCRIPTION

Figure 1:
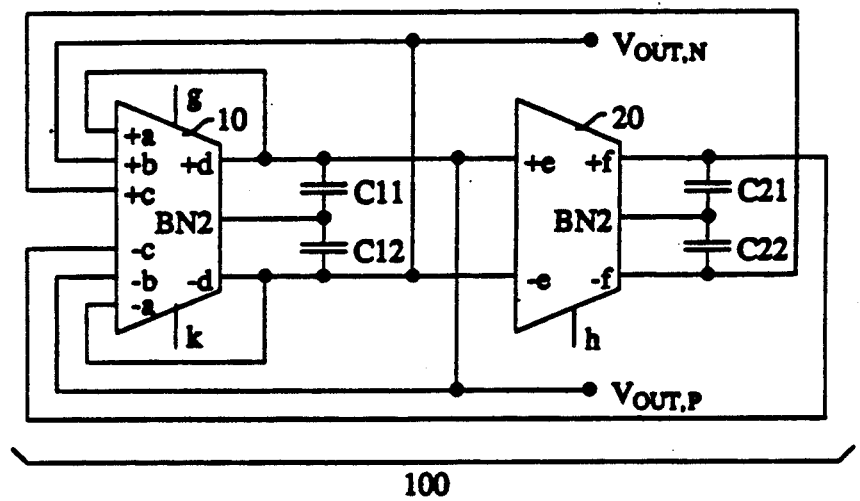
FIG. 1 is a block diagram of an oscillator containing a balanced triple-input transconductor having a current clamp that is merged with a transconductance amplifier, in accordance with the invention.

Referring now to the drawings, FIG. 1 shows an oscillator 100, in a balanced circuit configuration, comprising a balanced triple-input transconductor 10 and a balanced single-input transconductor 20, as well as a first pair of matched capacitors C11 and C12 and a second pair of matched capacitors C21 and C22. The triple-input transconductor 10 has three positive input points, +a, +b, and +c, and three negative input points −a, −b, and −c, as well as one positive output point +d and one negative output point −d. Note that because both transconductors 10 and 20 are balanced, the triple-input transconductor 10 has six physical input points, and the single-input transconductor 20 has two. That is to say, in a balanced circuit configuration the term "m-input transconductor" signifies 2m physical input points.

The positive output point +d of the triple-input transconductor 10 is connected to feed the input points +a and −b, as well as to feed the input point +e of the single-input transconductor 20. In addition, this positive output point +d is connected to feed one of the capacitors C11 and a positive output terminal $V_{OUT,P}$ of the oscillator 100.

The negative output point −d of the balanced triple-input transconductor 10 is connected to feed the capacitor C12, the negative input points −a and −e, the positive input point +b, and a negative output terminal $V_{OUT,N}$ of the oscillator 100. The overall output of the oscillator 100 is then equal to $V_{OUT,P}$-$V_{OUT,N}$.

The output point +f of the balanced single-input transconductor 20 is connected to feed the capacitor C21, as well as to feed the input point −c of the triple-input transconductor 10. Conversely, the output point −f of the balanced single-input transconductor 20 is connected to feed the capacitor C22, as well as to feed the input point +c of the triple-input transconductor 10. Thus, the single-input transconductor 20 delivers negative feedback to the triple-input transconductor 10. On the other hand, the triple-input transconductor 10 delivers both positive and negative input to itself. For example, the input point +a receives positive feedback from the positive output point +d, whereas the positive input point +b receives negative feedback from the negative output point −d.

The triple-input transconductor 10 has another input point k, which is optional and which can be used to adjust the amplitude of oscillation. In addition, the triple-input transconductor 10 may have yet another input point g, or plurality thereof, for adjusting (tuning) the frequency of oscillation F of the oscillator 100. Likewise, the single-input transconductor 20 may have another input point h, or a plurality thereof, for adjusting the frequency of oscillation by varying the transconductance of the transconductor 20.

The oscillator 100 is a quadrature oscillator because the output of the transconductor 20 is out of phase with the output of the transconductor 10 by π/2 radians. This π/2 phase shift results from the integration of the voltage V(+e)-V(e) with respect to time by the transconductor 20 operating in combination with capacitors C21 and C22.

It should be understood that the circuitry for implementing the triple-input transconductor 10 consists essentially of three balanced paths running from ±a, ±b, ±c to ±d, whereby input voltages V(+a), V(−a); V(+b), V(−b); V(+c), V(−c) applied to points ±a, ±b, ±c, respectively, are converted into balanced currents I(+a), I(−a); I(+b), I(−b); and I(+c), I(−c); respectively. These currents are then summed by a pair of current summers (not shown) into I(+a)+I(+b)+I(+c) and I(−a)+I(−b)+I(−c), which are delivered to points +d and −d, respectively. The circuitry for the conversion of V(+a) and V(−a) into I(+a) and I(−a), respectively, advantageously is a linear transconductance amplifier path merged with a current clamp—i.e., essentially a linear transconductance amplifier path in which, when the input voltage exceeds a predetermined amount, linearity ceases and the output current remains fixed. The circuitry for the conversion of V(+b) and V(−b) into I(+b) and I(−b), respectively, is a linear transconductance amplifier path, as is the circuitry for the conversion of V(+c) and V(−c) into I(+c) and I(−c), respectively.

Figure 2:
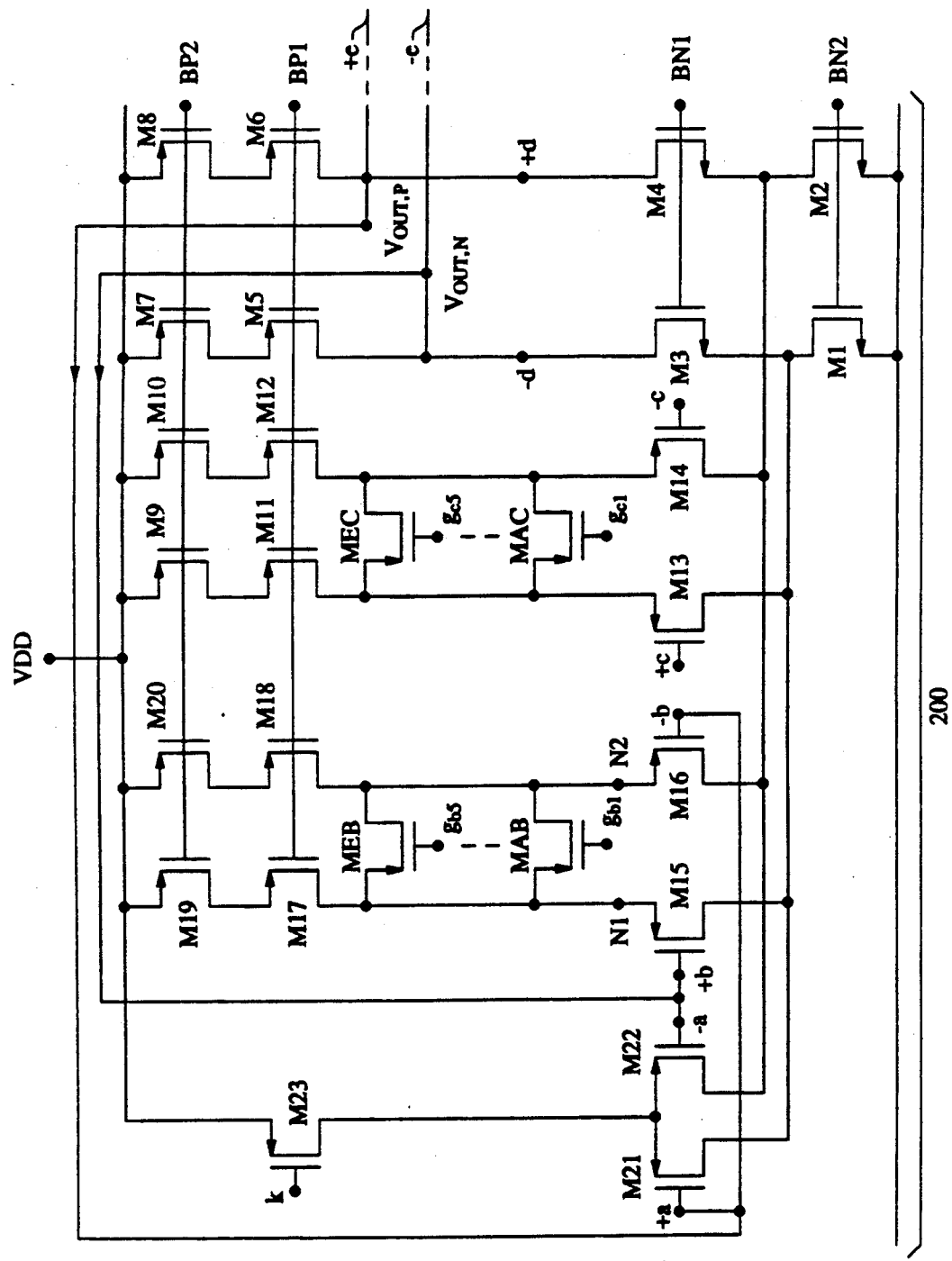
FIG. 2 is a schematic circuit diagram of the triple-input transconductor, in accordance with a specific embodiment of the invention.

Referring now to FIG. 2, a balanced triple-input transconductor circuit 200 represents a schematic drawing at the transistor level of a specific embodiment of the balanced triple-input transconductor 10 described above. Terminals and points that are similar in FIGS. 1 and 2 have been given the same reference labels. The circuit 200 is basically a complementary MOS (CMOS) circuit in which transistors M1, M2, M3, and M4 are n-channel transistors, whereas M5, M6, ... through M23 are all p-channel.

In addition, transconductance-tuning transistors MAB ... MEB and MAC ... MEC are p-channel transistors. Transistors MAB ... MEB and MAC ... MEC are all p-channel transistors, and serve to tune (vary) the transconductance, and hence damping, of inputs applied to points ±b and ±c, respectively, as more fully explained below.

During circuit operation, voltages $g_{b1}$ ... $g_{b5}$ are applied to the gate terminals of MAB ... MEB, respectively, and voltages $g_{c1}$ ... $g_{c5}$ are applied to the gate terminals of MAC ... MEC, respectively. Each of these voltages determine the on vs. off state of the respective transistor to which it is applied. Hence, the set of voltages $g_{b1}$ ... $g_{b5}$ determine the resistance between the source terminals of transistors M15 and M16—i.e., nodes N1 and N2—whereas the set of voltages $g_{c1}$ ... $g_{c5}$ determine the resistance between the source terminals of transistors M13 and M14. Typically, for an oscillator frequency of about 15 MHz, the resistance of each of these transistors MAB ... MEB and MAC ... MEC in the on state is in the range of about 5,000 to 20,000 ohms. Typically also, the input voltages $g_{b1}$ ... $g_{b5}$ and $g_{c1}$ ... $g_{c5}$ are selected such that $g_{b1} = g_{c1}$, ... $g_{b5} = g_{c5}$.

The transistors MAB ... MEB, by virtue of their resistive damping, serve to control the amount of negative feedback from points ∓d to points ±b. Similarly, the transistors MAC ... MEC control the amount of negative feedback from points ∓f (FIG. 1) to points ±c.

In addition, the transistors MAC ... MEC serve to tune (vary) the oscillation frequency F, as more fully explained below. On the other hand, the amplitude of oscillation can be varied by applying a voltage to input point k, i.e., the gate terminal of M23: The amplitude of oscillations is proportional to the source-drain current flowing in the source-drain path of transistor M23.

As further shown in FIG. 2, a positive power supply voltage VDD is supplied to the source terminals of M8, M7, M10, M9, M20, M19, and M23. A positive gate bias voltage BP2 is applied to the gate terminals of M8, M7, M10, M9, M20, and M19. Another positive gate bias voltage BP1 is applied to the gate terminals of M6, M5, M12, M11, M18 and M17. A gate bias voltage BN1 is applied to the gate terminals M4 and M3; and another gate bias voltage BN2 is applied to the gate terminals of M2 and M1. The source terminals of transistors M1 and M2 are connected to ground (negative power supply). These transistors are current sources. The amounts of current supplied by these sources are respectively equal to the sums of the four currents emanating from M3, M21, M15, M13 and M4, M22, M16, M14.

The p-channel transistor-pair M9 and M11 form a cascode current source, as does each of the p-channel transistor-pairs M10 and M12, M7 and M5, M8 and M6, M19 and M17, and M20 and M18. Transistor M23 forms a simple tunable current source. The n-channel transistor-pair M1 and M3 also forms a cascode current source, as does the n-channel transistor-pair M2 and M4.

It should be understood that in order for the transconductor 200 to oscillate, its output points ±d are respectively connected to the input points ±e of a single-input transconductor, such as 20 (FIG. 1), whose output points, such as ±f, are connected (in negative feedback polarity) to points ±c, respectively.

Typically the applied bias voltages are given approximately by VDD=5.0 volt; BP2=3.7 volt; BP1=3.1 volt; BN1=1.7 volt; and BN2=1.1 volt.

Advantageously, to balance the transconductor 200, each of the following is a matched pair: M1 and M2; M3 and M4; M5 and M6; M7 and M8; M9 and M10; M11 and M12; M13 and M14; M15 and M16; M17 and M18; M19 and M20; and M21 and M22.

The transistors M21 and M22 act as current steering devices, while transistor M23 acts as a current source. In response to a small signal voltage difference applied to points ±a, the increments in difference current—the difference in currents through M21 and M22—are linear with respect to the differences in applied signal voltages. However, when this signal difference exceeds a certain level, the difference current is clamped—i.e., does not change, because all of the current flowing through transistor M23 flows either through M21 or M22. Thus the transistors M21, M22, and M23 function together as a clamped linear transconductance amplifier path in which M23 is merged and acts as a current clamp.

The transistors in group MAB ... MEB and in group MAC ... MEG serve as resistors, typically five in each group. Each of their on-off states can be separately controlled by voltages $g_{b1}$ ... $g_{b5}$ and $g_{c1}$ ... $g_{c5}$, respectively, applied to their gate terminals. These terminals correspond to the input point g (FIG. 1) of the counterpart transconductor 10. Thus the set of transistors MAB ... MEB supply a controllable resistance, as does the set of transistors MAC ... MEC.

To explain the function served by the set of transistors MAB ... MEB acting as resistors, it is instructive to start in an initial situation where the voltages applied at points ±b are equal. Thus the currents $I_o$ through M15 and M16 then will also be equal, because of circuit symmetry. Starting with this initial situation, let an incremental voltage +ΔV be applied to point +b while an incremental voltage −ΔV is applied to point −b. Then an incremental voltage +ΔV will appear at the node N1 between M15 and M17, while an incremental voltage −ΔV will appear at the node N2 between M16 and M18, provided that ΔV is sufficiently small as explained below. Consequently, a voltage increment of $\Delta V - (-\Delta V) = 2\Delta V$ appears across nodes N1 and N2, and hence across the transistors MAB ... MEB acting as resistors, whereby an incremental current $i = 2\Delta V/R$ flows through them, where R is the parallel resistance of these transistors. Thus, the currents through transistors M15 and M16 become equal to $I_o - i$ and $I_o + i$, respectively. The difference in these currents is thus equal to $2i = 4\Delta V/R = (2/R)(2\Delta V)$, whereas the difference in the applied incremental voltages was equal to $\Delta V - (-\Delta V) = 2\Delta V$. Thus, the transconductance, and hence the reciprocal of the effective resistive damping, with respect to inputs at points $\pm b$ is equal to $2/R$. Thus, by adjusting R, this transconductance can be adjusted (tuned). Similarly, by adjusting the resistance across the transistors MAC ... MEC, the transconductance, and hence resistive damping, with respect to inputs at $\pm c$ can be tuned.

Note that the above requirement, that $\Delta V$ be sufficiently small, is satisfied when i is much less than $I_o$, whereby the gate-source voltage of M15 and of M16 is fixed.

The process of current summing by M1, and similarly by M2, operates as follows. In response to a negative-going signal applied to point $+a$, for example, the current through M21 increases, whereby the current through M3 decreases, because M1 is biased as a fixed current source. On the other hand, since the current through M3 has thus decreased, and because M5 and M7 form a fixed current source, the remaining current stemming from transistors M5 and M7 flows out of point $-d$ into capacitor C12. Similarly, in response to a positive-going signal applied to point $-a$, point $+d$ draws current from C12. Similar considerations apply to signals applied to points $\pm b$ and $\pm c$.

As mentioned above, voltages $g_{c1} \ldots g_{c5}$ applied to transistors MAC ... MEC tune the frequency F of oscillation of the oscillator 100 (FIG. 1). This property can be deduced from the fact that the frequency F basically is given by the transconductance of the triple-input transconductor 10 with respect to input voltages applied to points $\pm c$ divided by the series-connected capacitance of the matched capacitors C11 and C12. Thus, F is basically given by $2\pi F = (2/R_c) \div C/2 = 4/R_c C$, where $R_c$ is the parallel-connected resistance of the set MAC ... MEC (FIG. 2) and $C = C11 = C12$, assuming that the $\pm e$ inputs of transconductor 20 have the same transconductances as those of the $\pm c$ inputs of the transconductor 10 and that $C21 = C22 = C11 = C12$. Thus, by varying the voltages $g_{c1} \ldots g_{c5}$, the parallel resistance of MAC ... MEC can be varied, and hence the oscillation frequency F can be tuned.

Note that (within reasonable limits of operation), transistors M5, M6, M7, M8, M9, M10, M11, M12, M17, M18, M19 or M20 operate in their respective saturation regions, primarily because of the presence of the two bias voltages BP1 and BP2 applied to transistors (e.g., M17, M19) whose source-drain paths are connected in series.

Although the invention has been described in detail with respect to specific embodiments, various modifications can be made without departing from the scope of the invention. For example, the transconductors 10 and 20 need not be balanced—in which case the retained points are, for example, a, $-b$, $-c$, $+d$, $+e$, and $+f$. Also, in the circuit 200 p- and n-channel MOS transistors can be everywhere interchanged.

I claim:
1. A triple-input transconductor comprising
   (a) a first transconductance amplifier path, the path having a first output current point and a first input voltage point, a current clamp being merged in the amplifier path, the amplifier path being linear with respect to signal voltages that are less than a prescribed level applied to the first input voltage point;
   (b) a second transconductance amplifier path comprising a second output current point and a second input voltage point;
   (c) a third transconductance amplifier path comprising a third output current point and a third input voltage point;
   (d) integration means for summing and integrating first, second, and third currents flowing from the first, second, and third output points, respectively, whereby an output voltage is produced; and
   (e) first feedback means for positively feeding back the output voltage to the first input voltage point.
2. An oscillator comprising the triple-input transconductor recited in claim 1 and
   second and third feedback means for negatively feeding back separately the output voltage to the second and third input voltage points, respectively.
3. The oscillator of claim 2 in which the second feedback means includes a single-input transconductor.

* * * * *